INVENTOR.
IQBAL S. UPPAL
BY Robert E. Strauss
ATTORNEY

INVENTOR.
IQBAL S. UPPAL
BY Robert E. Strauss
ATTORNEY 3,426,289

SELF-CENTERING BIAS CIRCUIT FOR DC COUPLED CLASS B TRANSISTOR AMPLIFIER

Iqbal Singh Uppal, Batavia, N.Y., assignor to Sylvania Electric Products Inc., a corporation of Delaware Filed Aug. 29, 1966, Ser. No. 575,587
U.S. Cl. 330—22 11 Claims
Int. Cl. H03f 3/04

ABSTRACT OF THE DISCLOSURE

An amplifier stage includes in combination at least one pair of DC coupled Class B amplifier stages connected intermediate a voltage source and a voltage reference level and at least one transistor driver stage having an output electrode coupled to the signal input circuitry of the Class B amplifier stages and via an impedance to the voltage source, an input electrode coupled via an impedance to the voltage reference level, and a control electrode coupled to a signal source, to the junction of the DC coupled Class B amplifier stages, and by way of a uni-directional conduction device to the voltage reference level.

This invention relates to DC coupled transistor power amplifiers and more particularly to circuitry for maintaining a substantially centered bias potential for transistor power amplifiers of the Class B type.

In DC coupled Class B transistor amplifier circuitry such as the well known basic complementary and quasi-complementary circuits, each of the transistor amplifier stages is designed for Class B operation whereby each provides substantially one-half of an output signal available at a junction therebetween. Normally, these Class B transistor amplifiers are driven by a driver stage, usually operated Class A, having an output potential which is coupled to and determines the bias voltage on the Class B transistor amplifier stages.

However, it has been found that the utilization of a power supply which does not have near perfect regulation between full-load and no-load conditions causes a problem in that the output potential appearing at the junction of the Class B transistor amplifier stages does not vary in proportion to the variations in the power supply potential from no-load to full-load conditions. As a result, an AC signal applied to the driver stage is unevenly clipped causing a loss of maximum power output under high signal output level conditions.

Therefore, it is an object of this invention to provide circuitry for varying the output potential available from a DC coupled Class B power amplifier in proportion to variations in power supply potential.

Another object of the invention is to enhance the power available from a DC coupled Class B transistor power amplifier under high signal output level conditions.

A further object of the invention is to provide a self-centering bias circuit for a DC coupled Class B transistor power amplifier.

These and other objects are achieved in one aspect of the invention by circuitry which includes a pair of DC coupled Class B amplifier stages series connected intermediate a voltage source and a voltage reference level, a transistor driver stage having an output electrode coupled to the signal input circuits of the output stages and via an impedance to the voltage source, an input electrode coupled via an impedance to the voltage reference level, and a control electrode coupled to an AC signal source, to the junction of the Class B amplifier stages via an impedance, and to the voltage reference level by way of a uni-directional conduction device.

For a better understanding of the present invention, together with other and further objects, advantages, and capabilities thereof, reference is made to the following disclosure and appended claims in connection with the accompanying drawings in which:

Figure 1:
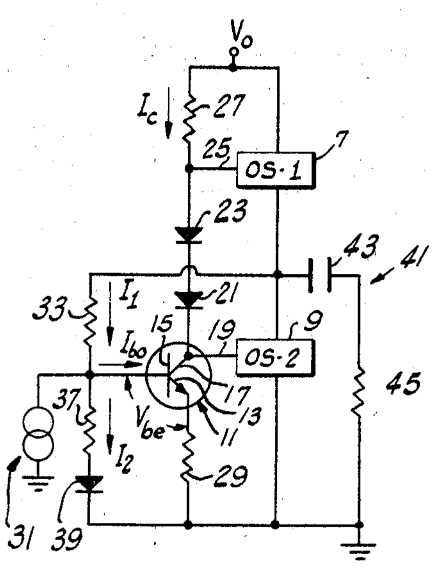
FIG. 1 is a block and schematic illustration of one embodiment of the invention.

Referring to the drawings, FIG. 1 illustrates one preferred embodiment of the invention. Therein, a first Class B transistorized amplifier stage 7, referred to as output stage one OS–1, and a second Class B transistorized amplifier stage 9, referred to as output stage two OS–2, are series connected intermediate a DC voltage source $V_0$ and a voltage reference level such as circuit ground. The utilization of Class B transistorized amplifier stage is well known and basic complementary or quasi-complementary amplifier circuits are applicable and appropriate examples of the amplifier stages, 7 and 9 respectively.

The amplifier stages, 7 and 9, are driven by an input circuit which includes a driver transistor 11 having an emitter or input electrode 13, a base or control electrode 15, and a collector or output electrode 17. The collector 17 of the driver transistor 11 is directly connected to the signal input circuit 19 of the second amplifier stage 9 and via a temperature compensating and bias developing network in the form of a pair of series connected diodes 21 and 23 to the signal input circuit 25 of the first amplifier stage 7. Also, a common load resistor 27 couples the junction of the diode 23 and the signal input circuit 25 to the DC voltage source $V_0$.

The emitter 13 of the driver transistor 11 is connected via a stabilizing resistor 29 to the voltage reference level. A signal available from an AC signal source 31 is applied to the base 15 of the driver transistor 11 and the base 15 is coupled by way of a feedback resistor 33 to the junction 35 of the series connected amplifier stages 7 and 9 and via a series connected resistor 37 and diode 39 to the voltage reference level. Also, an output circuit 41 including a series connected capacitor 43 and load resistor 45 is coupled intermediate the junction 35 of the amplifier stages 7 and 9 and the voltage reference level.

By way of explanation of the operation of the circuitry, it is known that DC coupled class B transistor amplifiers normally have a bias voltage applied thereto which is determined by the voltage appearing at the collector of a driver transistor. Also, it is known that the output voltage V center appearing at the junction 35 of the class B transistor amplifier stages OS–1 and OS–2 is readily adjusted to a value substantially equal to about one-half the value of the supply voltage $V_0$.

More specifically, the output stages OS–1 and OS–2 are normally operated in a common collector made to permit D.C. coupling and provide a unity voltage gain having a relatively low level of distortion. As a result, the swing of the output voltage appearing at the load resistor 45 is substantially the same as the swing of the A.C. voltage at the collector 17 of the driver transistor 11. Moreover, a relatively low value of resistance is chosen from the stabilizing resistor $R_{29}$ to prevent undesired D.C. voltage loss thereacross which would undesirably limit the maximum power available from the amplifier.

Assuming, for the moment, that the diode 39 is removed from the embodiment of FIG. 1, it can be readily understood that the voltage $V_c$ at the collector 17 of the driven transistor 11 will vary in accordance with the product of a constant $K_1$ and the voltage supply $V_0$ plus the product of a second constant $K_2$ and the base to emitter voltage drop $V_{be}$ of the transistor 11. Thus, $$V_c \approx K_1 V_o + K_2 V_{be}$$

where $$K_1 \approx 1 - \frac{R_{27}}{R_{27} + R_{29} + R_{33}\left(\frac{1}{B} + \frac{R_{29}}{R_{37}}\right)}$$

and where:

$$K_2 \approx \frac{R_{33}}{R_{37}}$$

$V_c$=Collector voltage
$V_o$=Supply voltage
$V_{be}$=Base to emitter voltage drop of transistor 11
B=Beta or transport factor of transistor 11.

Since the base to emitter voltage drop $V_{be}$ is, for all practical purposes, a substantially constant value, the above expression is illustrative of the fact that the collector voltage $V_c$ and consequently the output voltage V center of the amplifier stages 7 and 9 does not vary directly in accordance with variations in the supply voltage $V_o$. Rather, the collector voltage $V_c$ and output voltage V center undesirably varying in accordance with the supply voltage $V_o$ plus a fixed potential $K_2V_{be}$. Thus, it can be readily understood that an initial adjustment wherein the output voltage V center is equal to one-half the supply voltage $V_o$ value is not maintainable as the value of the supply voltage $V_o$ shifts due to normal loading because the fixed potential $K_2V_{be}$ does not shift with the shift in supply voltage $V_o$.

Figure 2:
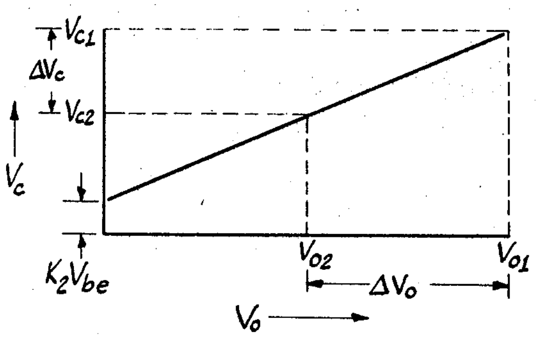
Prior Art Fig. 2
FIGS. 2 and 3 are graphic illustrations of prior art results.

Referring to FIG. 2 wherein is graphically illustrated the operation of the embodiment of FIG. 1 under the above-mentioned conditions, it can readily be seen that circuit constant adjustments permit the establishment of an initial value of voltage $V_{c1}$ at the collector 17 of the driver transistor 11 which is substantially equal to one-half the value of the initial supply voltage $V_{o1}$. Also, it can also be readily understood that a shift in value of the supply voltage $V_o$ to a value $V_{o2}$, provides a shift in the collector voltage $V_c$ to a value $V_{c2}$. Moreover, the shift in collector voltage $\Delta V_c$ is not proportional to the shift in supply voltage $\Delta V_o$ due to the fixed potential $K_2V_{be}$. Thus, the shifted collector voltage $V_{c2}$ is undesirably no longer equal to one-half the shifted supply voltage $V_{o2}$.

Referring to the above-mentioned shift in supply voltage $V_o$ due to loading, the driver transistor 11 will tend to maintain a substantially constant voltage drop across the resistor 33 causing the major portion of the voltage supply change to appear across the load resistor 27. More specifically, assume for a moment an initial value of supply voltage $V_{o1}$ of about 30 volts and a selection of circuit components such that there is provided an initial collection voltage $V_{c1}$ having a value of about 15 volts. As the circuitry loading is increased, the initial value of supply voltage $V_{o1}$ shifts to a second value $V_{o2}$ or about 26 volts for example. Thereupon, the voltage drop across the resistor 33 will tend to remain substantially constant due to the constant voltage characteristics of the base to emitter junction of driver transistor 11. Thus, the bias voltage applied to the second amplifier stage 9 will remain substantially constant at a value of about 15 volts.

However, the major portion of the supply voltage change $\Delta V_o$ will undesirably appear across the load resistor 27. As a result, the bias voltage applied to the first amplifier stage 7 and the output voltage available therefrom will undesirably be in the range of about 11 volts for example.

Figure 3:
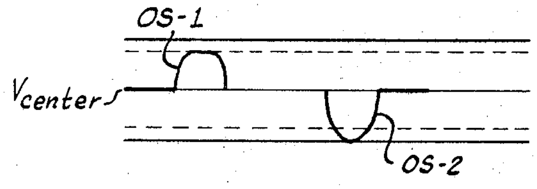
Prior Art Fig. 3

Thus, the bias voltage applied to and the output voltage available from the first amplifier stage 7 will be lower than the bias voltage applied to and the output voltage available from the second amplifier stage 9 as the supply voltage decreases in magnitude due to loading. This undesired unequal bias voltage and output voltage condition causes a deleterious uneven clipping of an applied signal and a loss of maximum available power at high level output conditions as illustrated in FIG. 3.

However, it has been found that the addition of the diode 39 in series connection with the resistor 37 intermediate the base 15 of the driver transistor 11 and a voltage reference level virtually eliminates the above-mentioned undesirable uneven clipping and loss of signal power under high level output conditions. Moreover, the diode 39 is preferably of the same semiconductive material as the transistor 11 whereby temperature compensation is accomplished in a manner well-known in the art.

Further, the addition of the diode 39 having a voltage drop $V_d$ thereacross which is substantially equal to the voltage drop $V_{be}$ from base to emitter of the driver transistor 11 essentially provides cancellation of the substantially fixed potential drop whereupon variations in supply voltage, $V_o$, normally occurring during loading of the circuitry, are accompaned by substantially proportional variations in the collector voltage $V_c$ of the driver transistor 11.

Mathematically expressed:

$$V_c \approx K_1 V_o + K_2 (V_{be} - V_{d39})$$

When $V_{be} \approx V_{d39}$ then $V_c \approx K_1 V_o$ where:

$V_c$=Collector voltage
$V_o$=Supply voltage
$V_{be}$=Transistor base to emitter voltage drop
$V_d$=Voltage drop across diode 39.

More specifically, the voltage $V_c$ appearing at the collector 17 of the transistor 11, when the diode 39 is not included in the circuitry, will be dependent upon the sum of the voltage drop across the resistor $R_{29}$, the base to emitter $V_{be}$, and the resistor $R_{33}$. Also, the current $I_1$ flowing through the resistor $R_1$ will be equal to the sum of the current $I_2$ flowing through the resistor $R_{37}$ and the base current $I_{bo}$. Further, the current $I_2$ flowing through the resistor $R_{37}$ will be equal to the sum of the base to emitter voltage drop $V_{be}$ and the voltage drop across the resistor $R_{29}$ divided by the resistance of the resistor $R_{37}$. Mathematically expressed:

$$V_c = I_c R_{29} + V_{be} + I_1 R_{33}$$

Also:

$$I_1 = I_2 + I_{bo};\ I_2 = \frac{V_{be} + I_c R_{29}}{R_{37}};\ I_{bo} = \frac{I_c}{B}$$

Substituting for $I_1$:

$$V_c = I_c R_{29} + V_{be} + R_{33}\left(\frac{V_{be} + I_c R_{20}}{R_{37}} + \frac{I_c}{B}\right)$$

Factoring out $I_c$:

$$V_c = I_c\left(R_{29} + \frac{R_{33}}{B} + \frac{R_{33}R_{29}}{R_{37}}\right) + V_{be}\left(1 + \frac{R_{33}}{R_{37}}\right)$$

Introducing diode 39 having a voltage drop $V_d$ substantially equal to $V_{be}$, the expression becomes:

(1)

$$V_c = I_c\left(R_{29} + \frac{R_{33}}{B} + \frac{R_{33}R_{29}}{R_{37}}\right) + (V_{be} - V_d)\left(1 + \frac{R_{33}}{R_{37}}\right)$$

$$= I_c\left(R_{29} + \frac{R_{33}}{B} + \frac{R_{33}R_{29}}{R_{37}}\right)$$

(2) Since $V_c = V_o - I_c R_{27}$

Substituting $I_c$ of expression 2 in expression 1 becomes:

$$V_c = \frac{V_o - V_c}{R_{27}}\left(R_{29} + \frac{R_{33}}{B} + \frac{R_{33}R_{29}}{R_{37}}\right)$$

Rearranging terms:

$$V_c = V_o\left(1 - \frac{R_{27}}{R_{27} + R_{29} + R_{33}\left(\frac{1}{B} + \frac{R_{29}}{R_{33}}\right)}\right)$$

Thus, when $V_o$ is substantially equal to $V_{be}$ and $V_c$ is initially adjusted to one-half the value of $V_o$, $V_c$ remains equal to one-half $V_o$ even though the value of $V_o$ shifts in accordance with the loading thereof.

Figure 4:
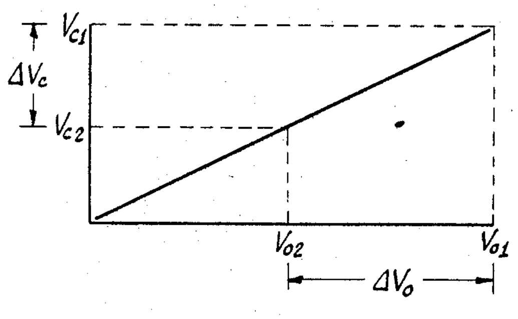
FIGS. 4 and 5 are graphic illustrations of results obtainable with the circuit embodiment of FIG. 1.
Figure 5:
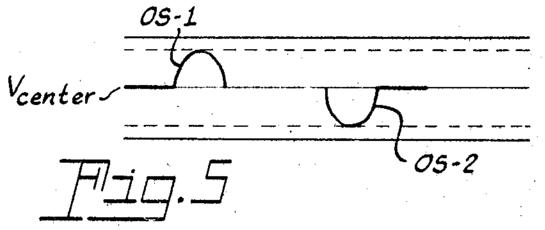

FIGS. 4 and 5 are graphically illustrating the above-mentioned highly desirable conditions. In FIG. 4, it can readily be seen that a shift $\Delta V_o$ in the supply voltage $V_o$ produces a substantially proportional shift $\Delta V_c$ in the voltage $V_c$ at the cvollector 17 of the driver transistor 11 due to the effective cancellation of the fixed voltage drop $V_{be}$, illustrated in FIG 2, across the driver transistor 11 by the voltage drop $V_o$ of the diode 39. Thus, a shift in supply voltage $V_o$ due to loading is accompanied by a self-centering shift in the bias voltage $V_c$ on the Class B amplifier stages 7 and 9 and a proportional shift in output voltages V center whereby uneven clipping is virtually eliminated as graphically illustrated in FIG. 5.

Figure 6:
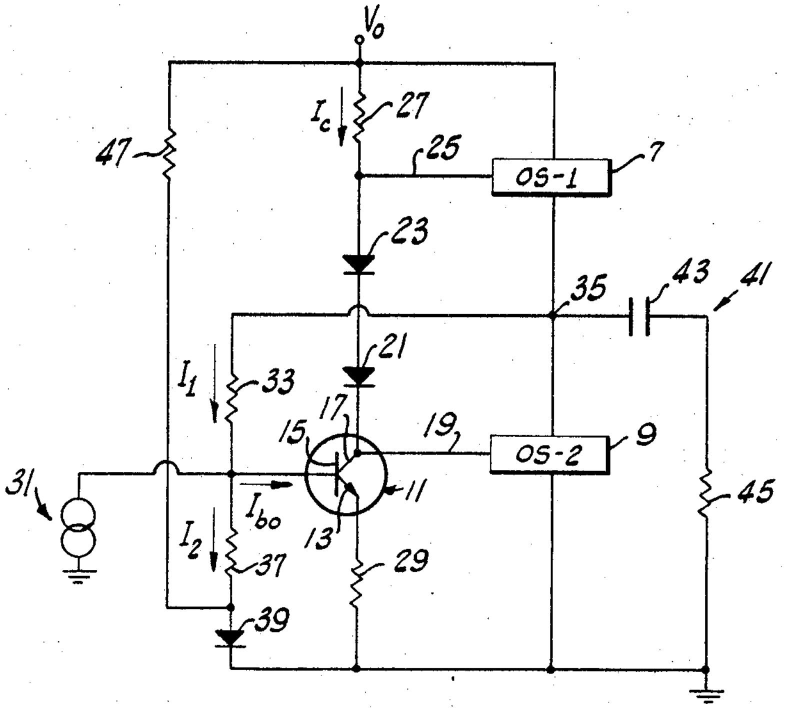
FIG. 6 is a block and schematic illustration of another embodiment of the invention.

In addition, FIG. 6 illustrates an enhanced embodiment of a self-centering bias circuit. This embodiment is similar to FIG. 1 and utilizes the same numbers for similar components. However, the supply voltage $V_o$, in this embodiment, is coupled to the junction of the series connected resistor 37 and unidirectional conduction device 39 via an additional resistor 47.

In this manner, the supply voltage $V_o$, which is the point of maximum voltage variation, is more directly connected to the uni-directional conduction device 39 causing an increase in current flow therethrough. As a result, the voltage drop $V_d$ across the uni-directional conduction device 39 can be more nearly matched to the voltage drop $V_{be}$ of the transistor 11 whereby cancellation thereof is more effectively provided. Thus, the addition of the resistor 47 permits a choice of transistors 11 having a wider range of electrical characteristics and, more importantly, maintains the previously described self-centering current balance of the circuitry over a wider range of variation in supply voltage $V_o$.

Figure 7:
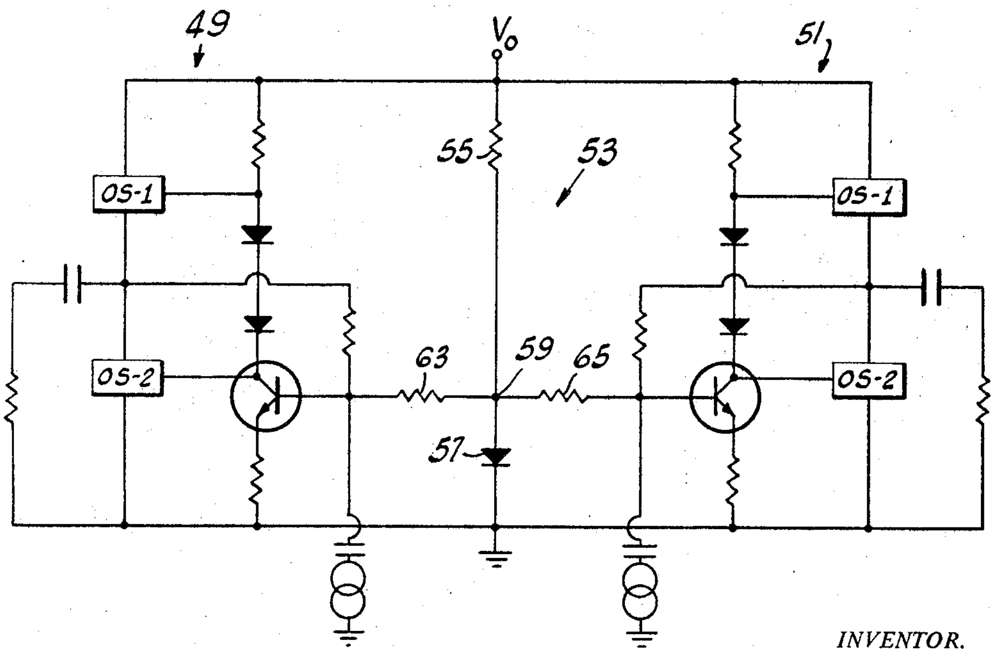
FIG. 7 is a preferred embodiment of the invention.

Further, FIG. 7 illustrates still another embodiment of the invention and similar components have been numbered in accordance with the illustrations of FIGS. 1 and 6. In this particular embodiment, a pair of substantially similar amplifier circuits 49 and 51 are connected in parallel intermediate the voltage source $V_o$ and the voltage reference level. Each of the amplifier circuits 49 and 51 is somewhat similar to the embodiments of FIGS. 1 and 6 in that each includes a first and second Class B transistor stage 7 and 9, a driver stage 11, and a load circuit 41.

However, this embodiment, FIG. 7, is particularly adapted to stereophonic application and includes an impedance network 53 having a series connected feedback resistor 55 and uni-directional conduction device 57 connected in parallel with the amplifier circuits 49 and 51 intermediate the voltage source $V_o$ and the voltage reference level. Also, the junction 59 of the resistor 55 and uni-directional conduction device 57 is coupled to the control electrode 15 of each of the driver transistors 11 in each of the amplifier circuits 49 and 51 respectively. Preferably, this coupling is provided by resistors 63 and 65 having substantially similar resistance values.

The operation of the embodiment of FIG. 7 is substantially similar to the operation of the embodiments of FIGS. 1 and 6 in that the effect of the substantially constant voltage drop $V_{be}$ from control to input electrodes of the driver stage 11 is substantially cancelled by the voltage drop $V_d$ across the uni-directional conduction device 57. Thus, a single uni-directional conduction device 57 serves both amplifier circuits 49 and 51 thereby enhancing circuitry simplification and economy. Moreover, by selecting a uni-directional conduction device 57 having a relatively low dynamic impedance value, it has been found that no cross-talk of consequence is introduced between the amplifier circuits 49 and 51 respectively.

Thus, there has been provided a self-centering bias circuit for a DC coupled Class B transistor power amplifier which greatly enhances the operation thereof. The enhanced bias circuitry virtually eliminates undesired uneven clipping of an output signal available from the amplifier and provides a maximum of available power at high level output potentials. Further, this desirable result is obtainable from a unitary power source having a minimum of regulating and stabilizing components. Thus, a highly desirable result is obtainable at a reduced cost. Moreover, the self-centering bias circuit includes temperature compensating componentry at no extra cost.

While there has been shown and described what is at present considered the preferred embodiment of the invention, it will be obvious to those skilled in the art that various changes and modifications may be made therein without departing from the invention as defined by the appended claims.

What is claimed is:

1. An amplifier circuit having self-centering bias means comprising in combination:
- a DC voltage source;
- first and second DC coupled Class B transistor stages series connected intermediate said voltage source and a voltage reference level;
- a driver stage including a transistor having input, control, and output electrodes;
- means for coupling the output electrode of said driver stage to the signal input circuit of said first and second Class B transistor stages and to said voltage source;
- means for coupling said input electrode of said driver stage to said voltage reference level;
- means for applying a signal to said control electrode of said driver stage and coupling said control electrode to the junction of said series connected class B transistor stages and to said voltage reference level, said means including a uni-directional conduction device connected intermediate said control electrode and said voltage reference level; and
- an output load circuit connecting the junction of said series connected Class B transistor stages and said voltage reference level.

2. The amplifier circuit of claim 1 including a substantially identical second amplifier circuit coupled in parallel therewith intermediate said voltage supply and said voltage reference level whereby stereophonic amplification is enhanced.

3. The circuitry of claim 1 including a temperature compensating impedance coupling the signal input circuits of said first and second Class B transistor stages and a second impedance coupling the junction of said temperature compensating impedance and said signal input circuit of said first class B transistor stages to said DC voltage source.

4. The circuitry of claim 1 including a third impedance connected in series with said uni-directional conduction device intermediate said driver stage control electrode and said voltage reference level.

5. The circuitry of claim 1 wherein the voltage drop measured between the input and control electrodes of said driver stage is substantially equal to the voltage drop measured between said control electrode and said voltage reference level whereby the potential appearing at the junction of said series connected Class B transistor stages varies substantially in proportion to variations in said DC voltage source.

6. The circuitry of claim 1 wherein said first and second class B transistor stages are connected in the form of a complementary circuit.

7. The circuitry of claim 1 wherein said first and second class B transistor stages are connected in the form of a quasi-complementary circuit.

8. The circuitry of claim 3 wherein said temperature compensating impedance coupling the signal input circuits of said first and second Class B transistor stages is in the form of a pair of series connected diodes.

9. The circuitry of claim 4 including a fourth impedance coupling said DC voltage source to the junction of said series connected uni-directional conduction device and said third impedance.

10. Stereophonic amplifier circuitry having self-centering biasing means comprising in combination:

a DC voltage source;

first and second substantially identical amplifier circuits connected in parallel intermediate said voltage source and a voltage reference level, each of said amplifier stages including a first and second Class B transistor stage series connected intermediate said voltage source and said reference voltage level, a load circuit coupling the junction of each of said series connected transistor stages to said reference voltage level, a driver stage for each of said amplifier stages including an input, output, and control electrode, means for coupling the output electrode of said driver stage to the signal input circuits of said series connected transistor stages and to said voltage source, means for coupling the input electrode of said driver stage to said voltage reference level;

an impedance network including a resistor and uni-directional conduction device series connected intermediate said voltage source and said voltage reference level; and means for coupling the junction of said series connected resistor and uni-directional conduction device to the control electrode of each of said driver stage in each of said first and second parallel connected amplifier circuits.

11. The stereophonic amplifier circuitry of claim 10 wherein said means for coupling the junction of said series connected resistor and uni-directional conduction device to the control electrode of said driver stage in each of said first and second parallel connected amplifier circuits includes a resistor.

References Cited

De Sa: "Build a COP 30/30 Transistor Stereo Amplifier," Radio-Electronics, pp. 48–51, July 1966.

Jones: "Efficient, High Quality Program Amplifier Circuits Using The Industrial Silicon Series 2N2107, 2N2108 and 2N2196," General Electric Application Note, pp. 5 and 6, April 1962.

ROY LAKE, *Primary Examiner.*

L. J. DAHL, *Assistant Examiner.*

U.S. Cl. X.R.

330—30